(12) United States Patent
Tsai et al.

(10) Patent No.: US 11,465,248 B1
(45) Date of Patent: Oct. 11, 2022

(54) SYSTEM AND METHOD FOR REMOVING COMPONENTS OF A FLUID COOLING SYSTEM DURING OPERATION

(71) Applicant: Cisco Technology, Inc., San Jose, CA (US)

(72) Inventors: Yaotsan Tsai, San Jose, CA (US); Yongguo Chen, Shanghai (CN); Zefeng Zhang, Fremont, CA (US); Hua Yang, Tracy, CA (US); Vic Hong Chia, Sunnyvale, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 17/365,275

(22) Filed: Jul. 1, 2021

(51) Int. Cl.
*B23P 15/26* (2006.01)

(52) U.S. Cl.
CPC .................. *B23P 15/26* (2013.01)

(58) Field of Classification Search
CPC . B23P 15/26; H05K 7/20781; H05K 7/20254; H05K 7/20272; H05K 7/20281; H05K 7/20772; H05K 7/20836; H05K 7/2079; H05K 7/20736
See application file for complete search history.

(56) References Cited

U.S. PATENT DOCUMENTS

| | | | |
|---|---|---|---|
| 2005/0244280 A1* | 11/2005 | Malone | H05K 7/20772 257/E23.098 |
| 2007/0089859 A1 | 4/2007 | Wei | |
| 2007/0121295 A1 | 5/2007 | Campbell et al. | |
| 2009/0133858 A1 | 5/2009 | Kumlin et al. | |
| 2013/0333865 A1 | 12/2013 | Goth et al. | |
| 2017/0049009 A1* | 2/2017 | Steinke | H05K 7/20736 |
| 2019/0182988 A1* | 6/2019 | Lunsman | H05K 7/20272 |
| 2020/0401198 A1 | 12/2020 | Zhang | |

OTHER PUBLICATIONS

Asetek, "Liquid cooling for data centers—Flexible, reliable & proven", 12 pages, retrieved from Internet Nov. 3, 2021; https://www.asetek.com/liquid-cooling/data-center/.
Techyparts, "CIARA Orion HF320-G3 2U 4-Bay 3.5" Rackmount Server CTO w/ Asus X99-WS/IPMI, 2 pages, retrieved from Internet Nov. 3, 2021; https://www.techyparts.com/servers-246/ciara-orion-hf320-g3-2u-4-bay-3-5-rackmount-server-cto-w-asus-x99-ws-ipmi.html.
Icetope, "Ku:1 chassis-level precision immersion", 14 pages, retrieved from Internet Nov. 3, 2021; https://www.iceotope.com/technologies/kul-chassis-level-precision-immersion/.

* cited by examiner

*Primary Examiner* — Lee A Holly
(74) *Attorney, Agent, or Firm* — Edell, Shapiro & Finnan LLC

(57) ABSTRACT

Presented herein is a system including a cold plate configured to thermally couple to a heat source and conduct heat from the heat source to a fluid. A heat exchanger fluidly coupled to the cold plate is configured to dissipate heat from the fluid. A first pump and a second pump are configured to induce a flow in the fluid, and a reservoir is configured to store at least a portion of the fluid. A manifold is directly fluidly coupled to each of the cold plate, the heat exchanger, an inlet and an outlet of the first pump, an inlet and an outlet of the second pump and an inlet and an outlet of the reservoir.

20 Claims, 8 Drawing Sheets

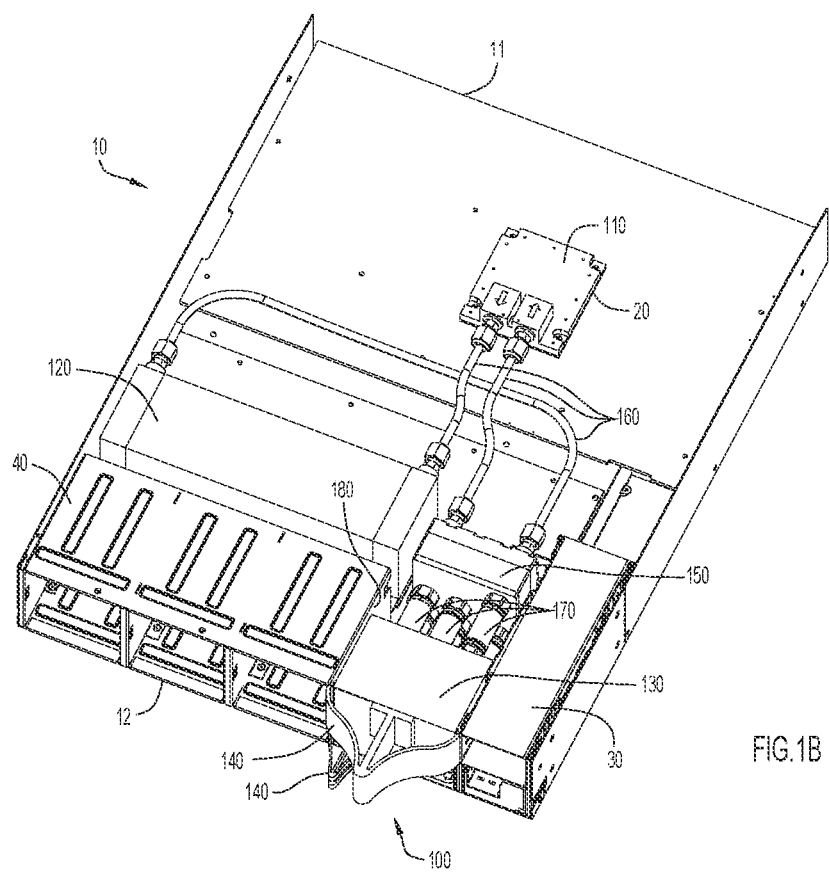

A-A

SYSTEM AND METHOD FOR REMOVING COMPONENTS OF A FLUID COOLING SYSTEM DURING OPERATION

TECHNICAL FIELD

The present disclosure relates to cooling arrangements for electronic devices.

BACKGROUND

As power consumption by application-specific integrated circuits (ASICs) and central processing units (CPUs) increases due to faster communication and computing requirements, the heat generated by the ASICs/CPUs increases as well. This results in an increased demand for cooling via a heatsink that is thermally coupled to the ASIC/CPU.

BRIEF DESCRIPTION OF THE DRAWINGS

FIG. 1B is a rear perspective view of the electronic device of FIG. 1A having a cooling system, according to an example embodiment.

DESCRIPTION OF EXAMPLE EMBODIMENTS

Overview

Presented herein is a system including a cold plate configured to thermally couple to a heat source and conduct heat from the heat source to a fluid. A heat exchanger fluidly coupled to the cold plate is configured to dissipate heat from the fluid. A first pump and a second pump are configured to induce a flow in the fluid, and a reservoir is configured to store at least a portion of the fluid. A manifold is directly fluidly coupled to each of the cold plate, the heat exchanger, an inlet and an outlet of the first pump, an inlet and an outlet of the second pump and an inlet and an outlet of the reservoir.

Example Embodiments

A liquid air assisted cooling system (LAAC) is a cooling system that cools a heat source by circulating a cooling liquid between a cold plate thermally coupled to the heat source and a heat exchanger. The LAAC system further includes a pump to circulate the cooling liquid and/or a reservoir for storing cooling liquid. The liquid cools the heat source by flowing through the cold plate to collect heat generated by the heat source and transports the heat to the heat exchanger. The heat exchanger cools the liquid by transferring the heat from the liquid to a flow of cooling air flowing through the heat exchanger. The cooled liquid circulates back to the cold plate where the cycle repeats.

One of the drawbacks of conventional LAAC systems is that the system and the heat source may often be shut down for a period of time for maintenance/replacement of the pump and/or reservoir. For example, the pump may have a limited life span (e.g., below the lifespan of the heat source) and the reservoir may become contaminated with particulates from worn pump parts and, thus, may need to be replaced. Additionally, the liquid circulating through the cooling system may leak to adjacent compartments, which may irreversibly damage electronic components disposed therein (e.g., a power supply, cooling fans, the heat source, etc.).

Figure 1A:
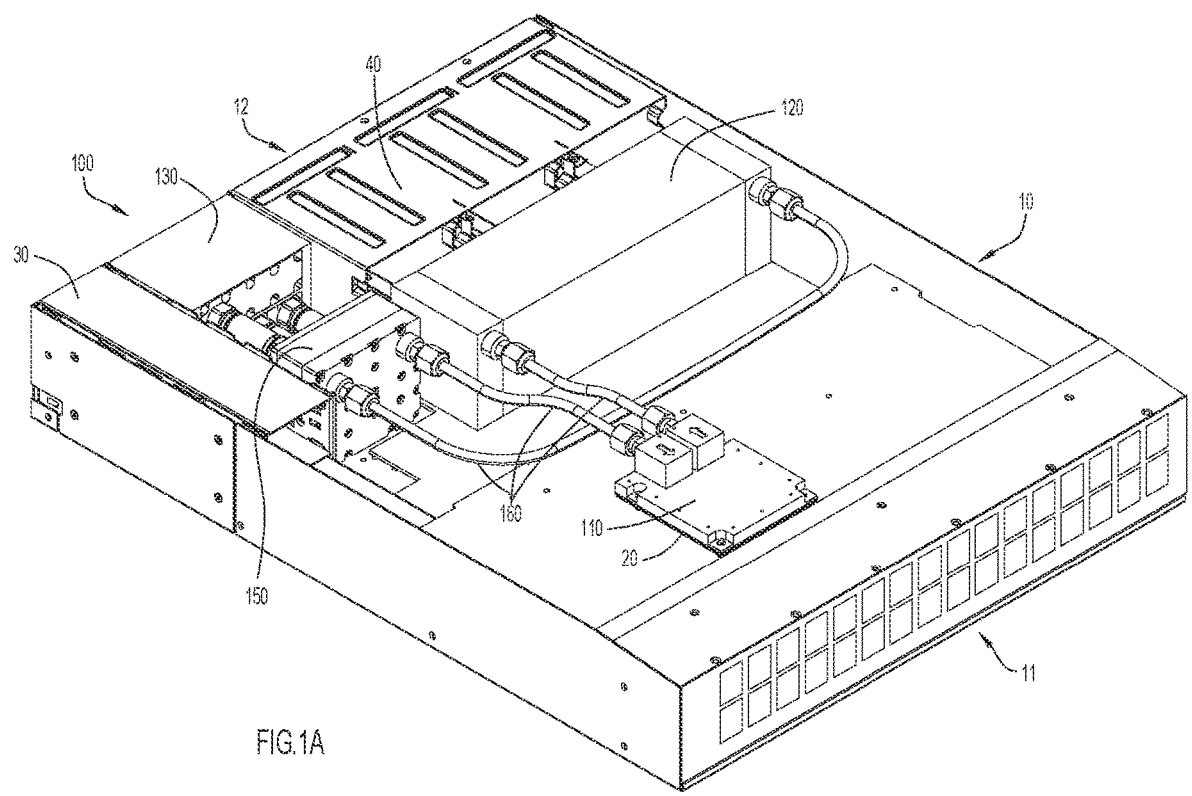
FIG. 1A is a front perspective view of an electronic device having a cooling system, according to an example embodiment.

With reference made to FIGS. 1A and 1B, a chassis 10 (for an electronic device) is shown, having a front end 11 and a back end 12, and a heat source 20 disposed between the front end 11 and back end 12. The heat source 20 may be ASIC/CPU/processor/chip or other circuitry that generates heat during operation. The chassis 10 further includes a power supply 30, a fan assembly 40, and a cooling system 100. The power supply 30 is configured to supply power to the electronic device contained in the chassis, as well as to the heat source 20, fan assembly 40, and the cooling system 100. The fan assembly 40 is configured to induce a flow of cooling air through the chassis 10. The cooling system 100 is configured to continuously cool the heat source 20, even while a component of the cooling system 100 is removed.

The cooling system 100 includes a cold plate 110 thermally coupled to the heat source 20, a heat exchanger 120, a fluid reservoir 130, a plurality of pumps 140, and a manifold 150. A plurality of fluid pipes 160 fluidly couples the manifold 150 to the heat exchanger 120 and cold plate 110. A plurality of quick release connectors 170 fluidly couple the manifold 150 to each of the reservoir 130 and the plurality of pumps 140.

To capture any cooling fluid that may leak from the pumps 140, reservoir 130, and/or the manifold 150 onto the adjacent compartments of the chassis 10, the cooling system 100 further includes a carrier 180 that receives the plurality of pumps 140 and the reservoir 130. That is, the carrier 180 contains cooling fluid that may leak from the quick release connectors 170 and prevents the leaked fluid from flowing into adjacent compartments of the chassis 10.

During operation, the plurality of pumps 140 pump a fluid (e.g., a dielectric liquid) from the reservoir 130 and through the cooling system 100. The fluid flows through the cold plate 110 where it collects heat generated by the heat source 20, thereby cooling the heat source 20. The fluid then flows to the heat exchanger 120 where the collected heat is transferred to the flow of cooling air from the fan assembly 40, thus cooling the fluid. The cooled fluid then flows back to manifold 150 which directs the fluid to the reservoir 130. The cooling fluid is then recirculated through the cooling system 100.

While the cooling system 100 is operating, at least one of the pumps 140 and the reservoir 130 can be removed and/or replaced via the quick release connectors 170. That is, a pump 140 and/or a reservoir 130 can be removed from the cooling system 100 without shutting down the cooling system 100 or the heat source 20. When the pumps 140 and/or reservoir 130 are disconnected from the manifold 150, the quick release connectors 170 close and prevent the fluid from leaking from the removed components (e.g., a pump 140 and/or reservoir 130) and the manifold 150. For example, if the reservoir 130 and/or a pump 140 is removed from the system, the manifold 150 redirects the flow of fluid from an inlet and an outlet of the removed component. That is, the manifold 150 can bypass the reservoir 130 and/or a pump 140 in response to the reservoir 130 and/or pump 140 being removed, while at least one remaining pump 140 maintains the flow of fluid through the remainder of the cooling system 100 without leaking fluid.

Figure 2A:
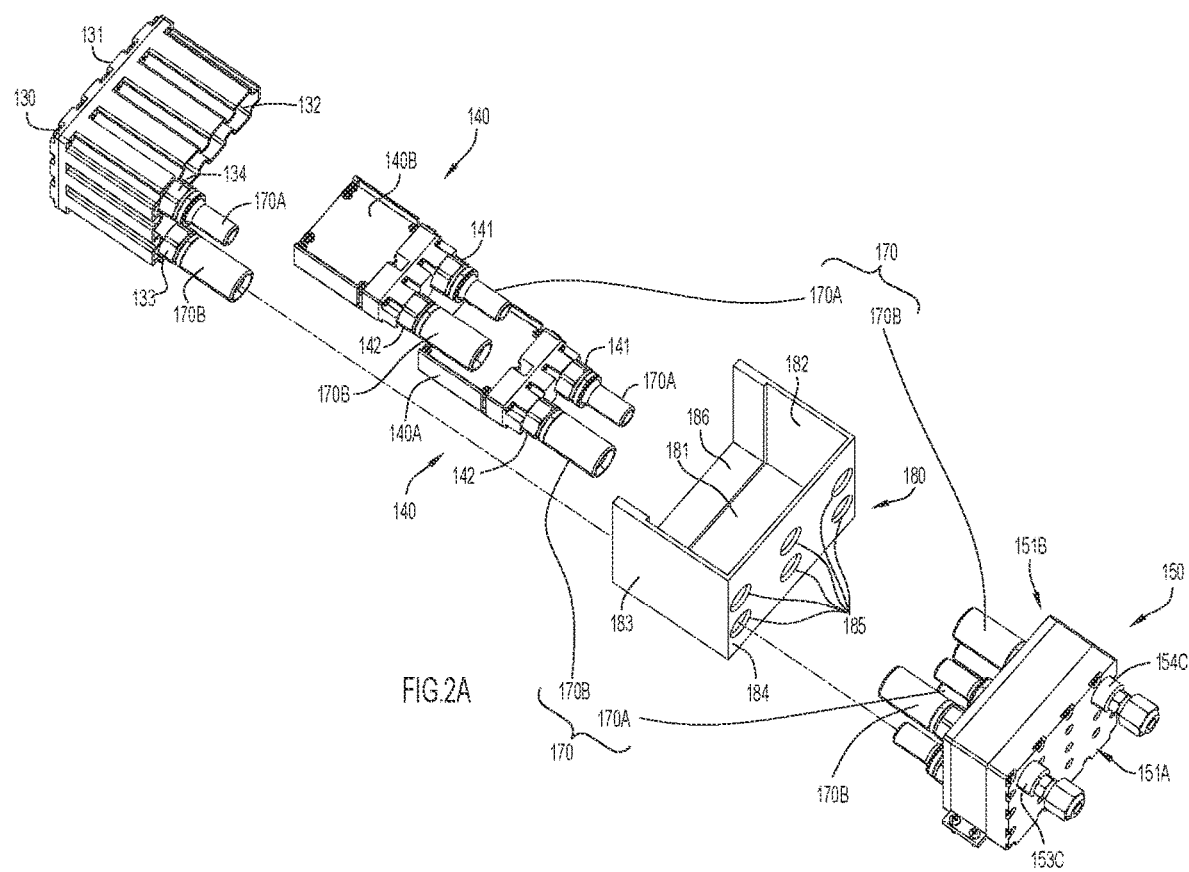
FIG. 2A is an exploded view of the cooling system that includes a reservoir, a plurality of pumps, a manifold and carrier, according to an example embodiment.
Figure 2B:
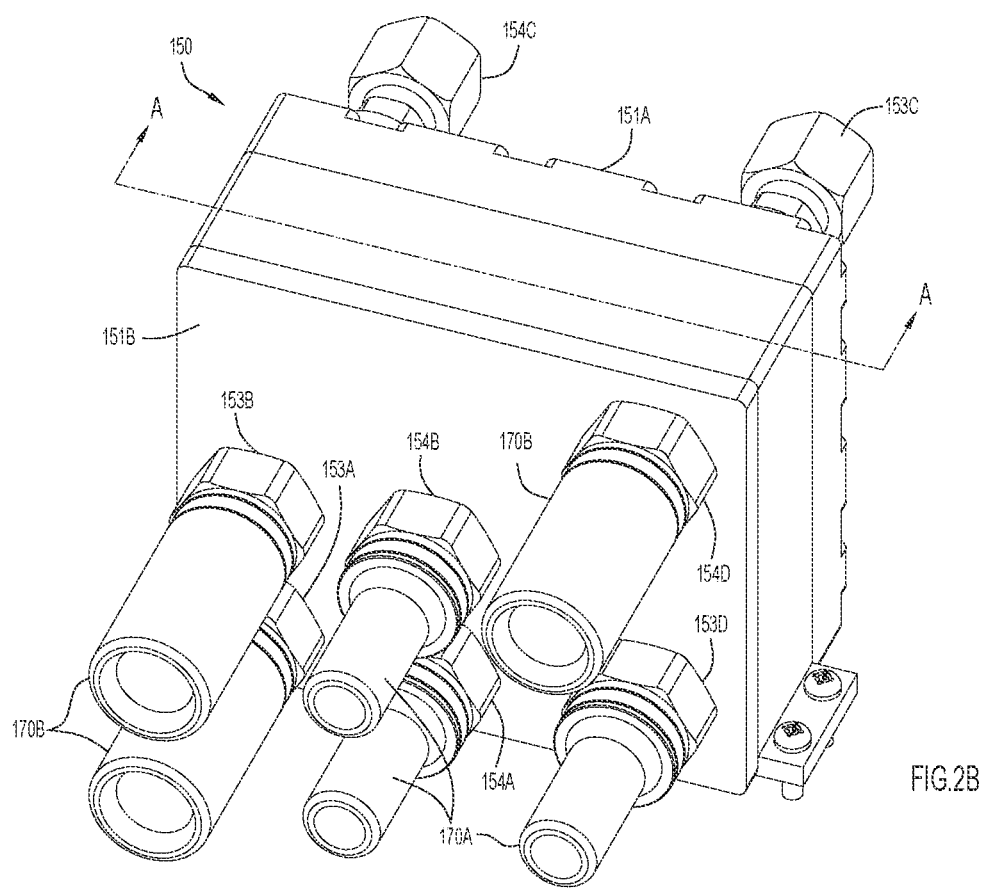
FIG. 2B is a rear perspective view of the manifold depicted in FIG. 2A, according to an example embodiment.

Reference is now made to FIGS. 2A and 2B for a description of the arrangement of the reservoir 130, the fluid pumps 140 (where a first fluid pump is shown at 140A and a second fluid pump is shown at 140B), the manifold 150, the quick release connectors 170 and carrier 180. The reservoir 130 comprises a housing 131 defining an internal cavity 132, a reservoir outlet 133, and a reservoir inlet 134. The reservoir outlet 133 and reservoir inlet 134 provide fluid passages through the housing 131 to the internal cavity 132. The reservoir 130 is configured to store at least a portion of the cooling fluid in the cavity 132 of the housing 131. Each of the first and second pumps 140A and 140B includes a pump outlet 141 and a pump inlet 142, and is configured to induce a flow of fluid from the pump inlet 142 to the pump outlet 141.

As illustrated in FIG. 2A, the reservoir 130, first and second pumps 140A and 140B, and quick release connectors 170 are received in the carrier 180. The carrier 180 is configured to contain fluid that may leak from the reservoir 130, pumps 140, or quick release connectors 170. The carrier 180 includes a base 181, a first sidewall 182, a second sidewall 183, and a front wall 184. The front wall 184 defines a plurality of through holes 185 configured to receive the quick release connectors 170 and provide access to the manifold 150. Seals (not shown) may be disposed in the through holes 185 between the quick release connectors 170 and the front wall 184. The seals may prevent fluid from leaking out of the carrier 180 and into other compartments of the chassis 10. In some implementations, the seals may be O-rings.

In the illustrated embodiment, the first and second pumps 140A and 140B are stacked vertically and the reservoir housing 131 has an "L" shape to accommodate the reservoir 130 and the first and second pumps 140A and 140B within the carrier 180. The reservoir housing 131 surrounds a portion of the first and second pumps 140A and 140B. The reservoir 130 and first and second pumps 140A and 140B may provide a barrier to fluid leaking out the back of the carrier 180. For example, a seal 186 may be disposed between the reservoir housing 131 and first and second pumps 140A and 140B, and the carrier 180. That is, the seal 186 may be disposed along an inner surface of the base 181, first sidewall 182, and second sidewall 183, and may be configured to engage the reservoir housing 131 and pumps 140. In some implementations, the carrier 180 may include a back wall to prevent fluid from exiting the rear. In other implementations, the reservoir 130 housing may be rectangular shaped and the pumps 140 may be aligned laterally (e.g., arranged along the same horizontal plane).

Still referring to FIG. 2A, the reservoir 130 and each of the pumps 140 are independently coupled to the manifold 150 via quick release connectors 170. That is, the reservoir outlet 133 is fluidly coupled to the manifold 150 via quick release connector 170, and the reservoir inlet 134 is fluidly coupled to the manifold 150 via another quick release connector 170. Similarly, each outlet 141 and inlet 142 of the pumps 140 are fluidly coupled to the manifold 150 through a corresponding set of quick release connectors 170.

Each quick release connector 170 includes a male end 170A and a female end 170B. The female end 170B is configured to receive the male end 170A. When the male end 170A is coupled to the female end 170B, the quick release connector 170 allows fluid to flow therethrough. In response to the male end 170A disengaging the female end 170B, each of the male and female ends 170A and 170B automatically closes or seals, and thus, prevents fluid from flowing therethrough. In some implementations, each of the male and female ends 170A and 170B includes a valve that closes in response the male end 170A being removed from the female end 170B.

As depicted in FIG. 2A, the reservoir outlet 133 receives a female end 170B of a quick release connector 170, and the reservoir inlet 134 receives a male end 170A of another quick release connector 170. Meanwhile, the outlets 141 of the first and second pumps 140A and 140B receive male ends 170A and the inlets 142 of the first and second pumps 140A and 140B receive female ends 170B. The male and female ends 170A and 170B are configured to engage quick connector female and male ends 170B and 170A, respectively, disposed in the manifold 150.

Now referring to FIG. 2B, the manifold 150 includes a front plate 151A and a back plate 151B having a plurality of inlets 153A-153D and outlets 154A-154D. The back plate 151B includes inlets 153A, 153B, and 153D and outlets 154A, 154B, and 154D for fluidly coupling the manifold to the pumps 140 and reservoir 130. The front plate 151A includes the inlet 153C for fluidly coupling to the heat exchanger 120 and the outlet 154C for fluidly coupling to the cold plate 110.

The first manifold inlet 153A and first manifold outlet 154A are configured to fluidly couple to a first pump 140A via a set of quick release connectors. The first manifold inlet 153A receives a female end 170B of a quick release connector corresponding to the first pump 140A, and the first manifold outlet 154A receives a male end 170A of another quick release connector corresponding to the first pump 140A. Similarly, the second manifold inlet 153B and the second manifold outlet 154B are configured to fluidly couple to the second pump 140B via another set of quick release connectors. The second manifold inlet 153B receives a female end 170B of a quick release connector, and the second manifold outlet 154B receives a male end 170A of another quick release connector. A third manifold inlet 153C and a third manifold outlet 154C are configured to fluidly couple to the heat exchanger 120 and cold plate 110, respectively, via fluid pipes. The fourth manifold inlet 153D and the fourth manifold outlet 154D are configured to fluidly couple to the reservoir 130 via another set of quick release connectors. The fourth manifold inlet 153D receives a male end 170A of a quick release connector, and the fourth manifold outlet 154D receives a female end 170B of another quick release connector. While the figures illustrate a specific arrangement between the male and female ends 170A and 170B and the inlets and outlets of the pumps 140, the reservoir 130 and the manifold 150, embodiments are not limited thereto. For example, either a male end 170A or a female end 170B may be disposed in either an inlet or an outlet, so long as the corresponding opposite end of the quick release connector is disposed in a corresponding component outlet or inlet.

Figure 3:
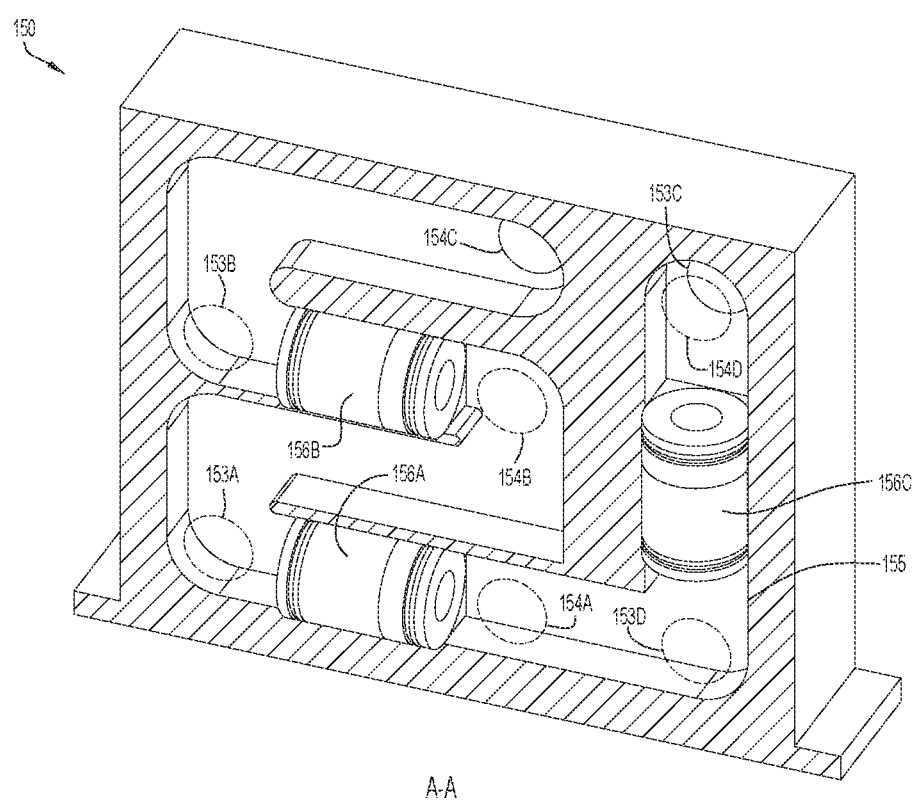
FIG. 3 is a cross-sectional view of the manifold taken along line A-A of FIG. 2B, according to an example embodiment.

Now referring to FIG. 3, a cross-sectional view of the manifold 150 taken along line A-A of FIG. 2B is illustrated. The manifold 150 further includes a fluid channel 155 configured to direct the flow of fluid between the manifold inlets 153A-153D and manifold outlets 154A-154D. The fluid channel 155 may be defined by one or more grooves machined into the front and back plates 151A and 151B. A plurality of one-way check valves 156A-156C are disposed in the fluid channel 155 to direct the flow of fluid through the manifold 150. The check valves 156A-156C are configured to prevent the flow of fluid from flowing backwards through the fluid channel 155. For example, a first check valve 156A is disposed between the first outlet 154A and first inlet 153A. The first check valve 156A is configured to allow fluid flow from the first outlet 154A to the first inlet 153A, but prevents fluid flow from the first inlet 153A to the first outlet 154A. A second check valve 156B is disposed between the second outlet 154B and the second inlet 153B. The second check valve 156B is configured to allow fluid flow from the second outlet 154B to the second inlet 153B, but prevents fluid flow from the second inlet 153B to the second outlet 154B. The third check valve 156C is disposed between the fourth outlet 154D and the fourth inlet 153D. The third check valve 156C is configured to allow fluid flow from the fourth outlet 154D to the fourth inlet 153D, but prevents fluid flow from the fourth inlet 153D to the fourth outlet 154D.

Figure 4:
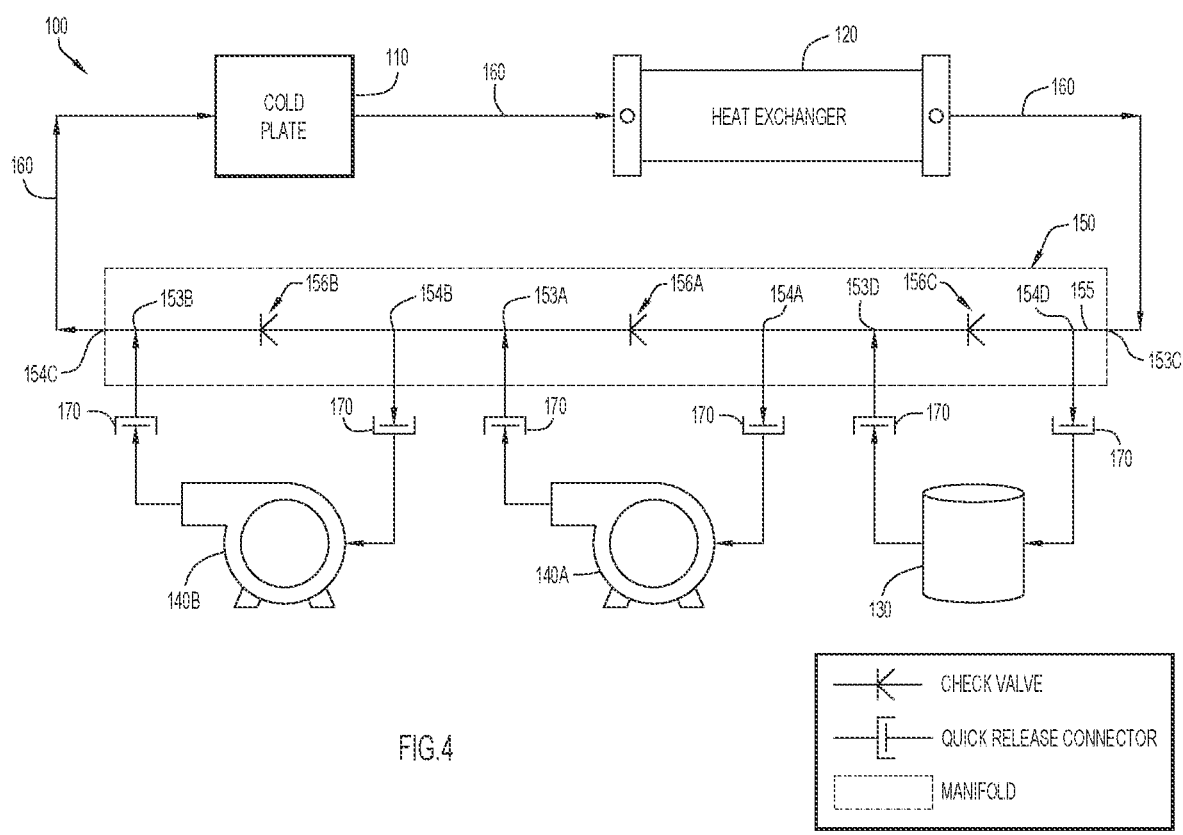
FIG. 4 is a schematic diagram of a fluid circuit of the cooling system, according to an example embodiment.

FIG. 4 is a schematic diagram showing the fluid circuit of the cooling system 100. The first pump 140A receives cooling fluid from the first outlet 154A of the manifold 150 via a quick release connector 170 and pumps the fluid through a quick release connector 170 to the first inlet 153A of the manifold 150. The manifold 150 directs flow of fluid from the first inlet 153A to the second outlet 154B of the manifold 150 via the manifold channel 155 and the first check valve 156A. That is, the first check valve 156A prevents the fluid from flowing from the first inlet 153A to the first outlet 154A. The fluid then flows from the second outlet 154B to the second pump 140B via a quick release connector 170. The second pump 140B pumps the fluid through a quick release connector 170 to the second inlet 153B. The manifold 150 directs flow of fluid from the second inlet 153B to the third outlet 154C of the manifold 150 via the manifold channel 155 and the second check valve 156B. That is, the second check valve 156B prevents the fluid from flowing from the second inlet 153B to the second outlet 154B. The fluid flows through a fluid pipe 160 to the cold plate 110 where it cools the cold plate 110. That is, the cold plate 110 transfers heat (generated by the heat source 20) to the fluid. The fluid flows to the heat exchanger 120 via fluid pipe 160. The heat exchanger 120 cools the fluid by removing the heat from the fluid. The fluid continues to flow to the third inlet 153C of the manifold 150 via fluid pipe 160 and to the fourth outlet 154D via fluid channel 155. The fluid flows from the fourth outlet 154D to the reservoir 130 via a quick release connector 170. From the reservoir 130, the fluid flows through a quick release connector 170 to the fourth inlet 153D. The fluid channel 155 guides the flow of fluid back to the first outlet 154A where the cycle repeats.

During operation, the cooling fluid circulates through the cooling system 100 to cool the cold plate 110 and thus, cool a thermally coupled heat source. The cooling system 100 may continue to operate if first pump 140A or second pump 140B and/or the reservoir 130 fails and/or is removed for replacement. The independent coupling of each component (e.g., the first pump 140A, the second pump 140B, and the reservoir 130) to the manifold 150 via the quick release connectors 170 and the check valves 156A-156C enables the manifold 150 to automatically bypass a component that is clogged and/or removed during a maintenance operation.

Figure 5:
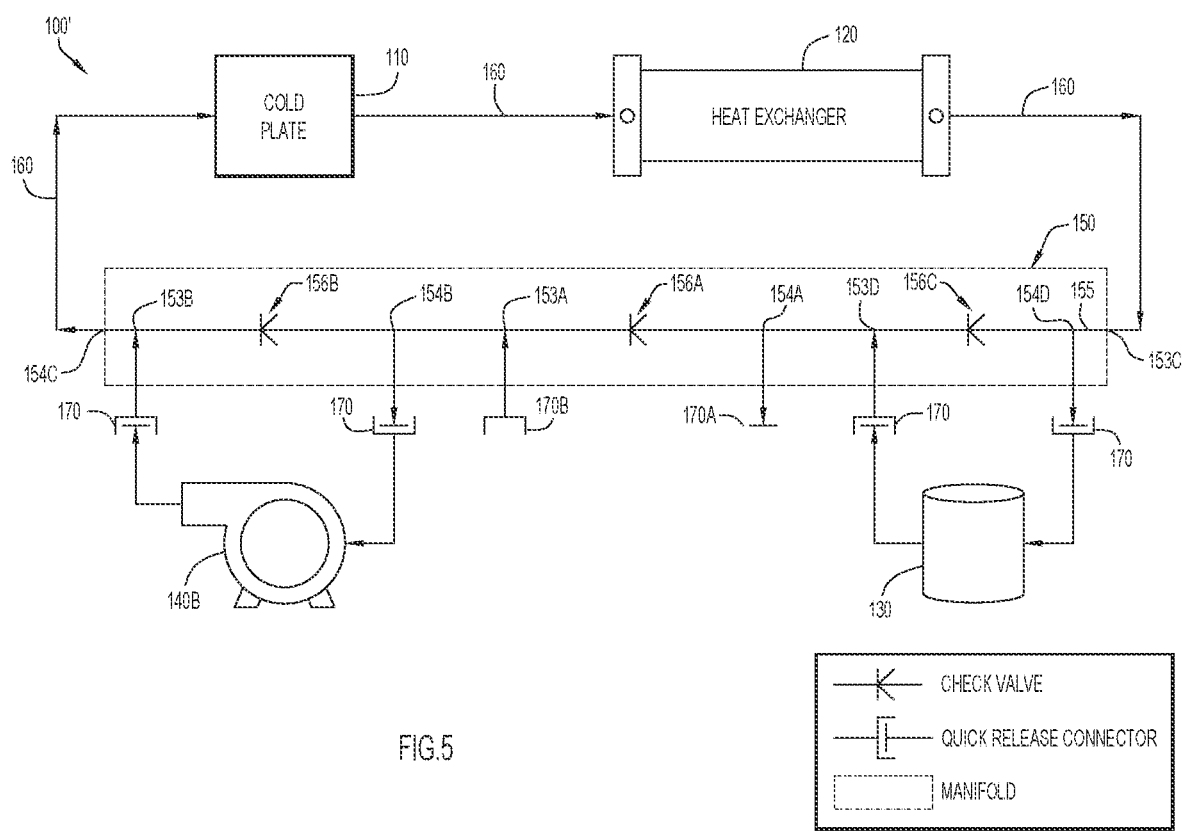
FIG. 5 is a schematic diagram of a fluid circuit of the cooling system, similar to FIG. 4, but with a pump removed, according to an example embodiment.

FIG. 5 illustrates a schematic diagram of the fluid circuit of the cooling system 100 during a maintenance operation, when a pump has been removed. Since a pump has been removed from the cooling system, the cooling system in FIG. 5 is denoted by reference numeral 100'. For clarity, only the differences between the fluid circuits of FIG. 4 and FIG. 5 are discussed. The cooling system 100' differs from cooling system 100 in that the first pump 140A has been removed. For example, the maintenance operation may be replacement of the first pump 140A. The flow of fluid is prevented from leaking out of the first outlet 154A and the first inlet 153A via connected male and female ends 170A and 170B, respectively, of the quick release connectors 170. As discussed above, the male and female ends 170A and 170B close in response to a connected component being removed. With the first outlet 154A and first inlet 153A closed, the fluid is directed through the first check valve 156A to the second outlet 154B. That is, the manifold 150 bypasses the first pump 140A and directs the flow of fluid to the second outlet 154B via the first check valve 156A. From the second outlet 154B, the fluid flows through a quick release connector 170 to the second pump 140B. The second pump 140B maintains the circulation of the fluid through the cooling system 100'. The fluid continues to flow through the remainder of the cooling system 100' in a similar manner as that of the cooling system 100 discussed above with reference to FIG. 4.

A new first pump may be installed while the second pump 140B maintains circulation of the fluid. The new first pump couples to the female and male ends 170B and 170A disposed in the first inlet 153A and first outlet 154A, respectively of the manifold 150. For example, corresponding male and female ends 170A and 170B of a pair of quick release connectors may be engaged to couple the new pump to the manifold 150 and opening the pair of quick connectors. Once installed and coupled to the manifold 150, the fluid may circulate through the first outlet 154A, through the new pump and to the first manifold inlet 153A via the quick release connectors 170. The fluid can then circulate through the entire cooling system 100 as shown in FIG. 4.

While the first pump 140A has been removed in the depicted embodiment, embodiments are not limited thereto. In some implementations, the reservoir 130 may be removed and the manifold 150 bypasses the reservoir 130 and first pump 140A. In yet another implementation, the first pump 140A maintains the flow of fluid through the cooling system 100', while the second pump 140B and/or the reservoir 130 are removed and the manifold 150 bypasses the second pump 140B and/or the reservoir 130.

As discussed above, the quick release connectors 170 are self-sealing and prevent fluid from leaking when a component is removed from the manifold 150. That is, the quick release connectors 170 allow the pumps and the reservoir to be removed during operation without the cooling fluid leaking onto the chassis 10 and impacting electronic components. Further, the removed component can be quickly and easily replaced by fluidly coupling a new component to the manifold 150 via the quick release connectors without shutting down the cooling system 100, 100'. Therefore, the cooling system 100, 100' may continuously operate during a maintenance operation.

Figure 6:
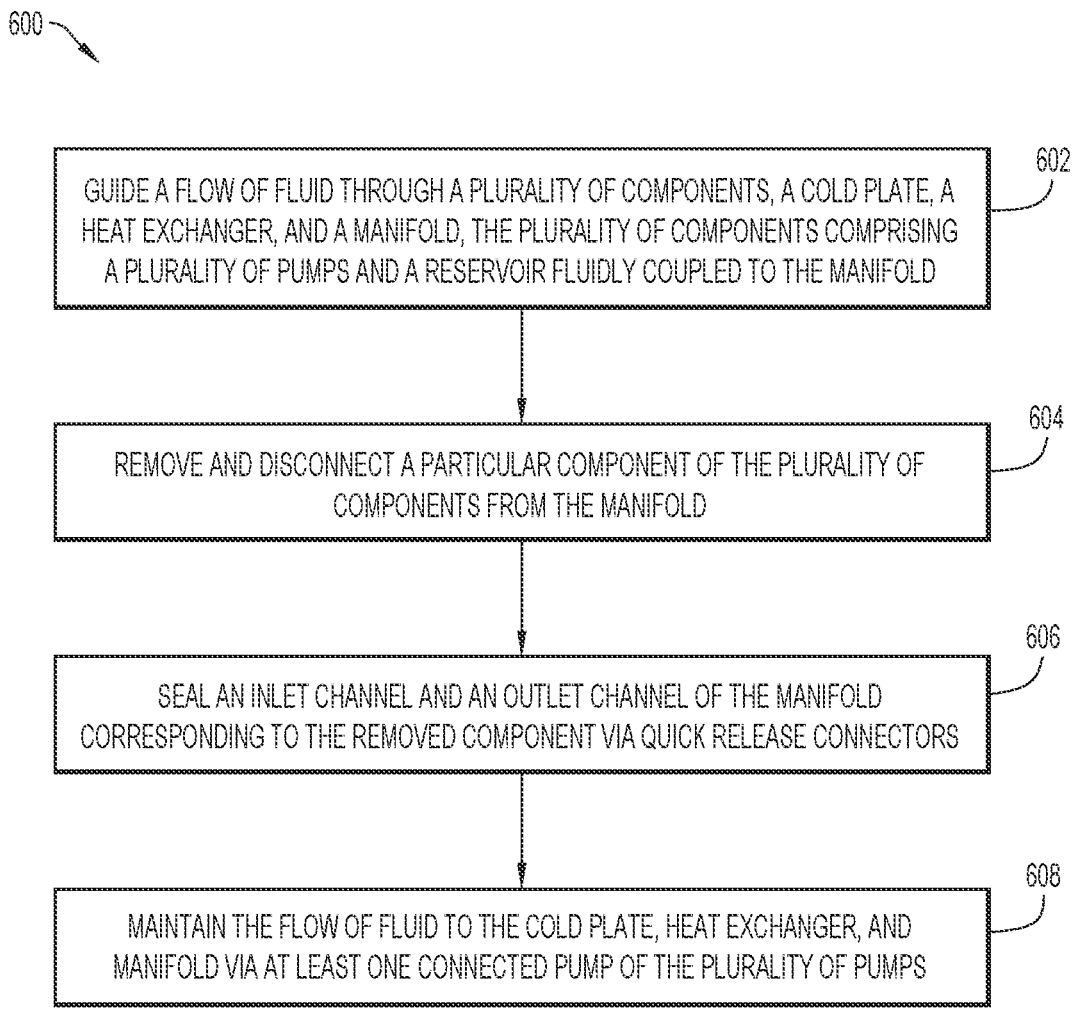
FIG. 6 is a flow diagram of a method for replacing a component of a cooling system, according to an example embodiment.

With reference to FIG. 6, a flow diagram is shown of a method 600 of removing a component of a cooling system, such as the cooling system described above in connection with FIGS. 1A-5. The method 600 includes guiding a flow of fluid through the cooling system in operation 602, removing and disconnecting a particular component from the cooling system in operation 604, sealing an inlet channel and outlet channel of the cooling system corresponding to the removed component in operation 606, and maintaining the flow of the fluid through the cooling system via at least one connected pump in operation 608.

More specifically, in operation 602, the flow of fluid is guided through a plurality of components, a cold plate, a heat exchanger and a manifold. The plurality of components includes the plurality of pumps and the reservoir fluidly coupled to the manifold. For example, the fluid is transported from the reservoir to the manifold 150 from the manifold to a first pump of the plurality of pumps. The first pump pumps the fluid back to the manifold. The manifold guides the flow of fluid to a second pump of the plurality of pumps. The second pump pumps the fluid to the manifold. The manifold guides the flow of fluid to cold plate via a manifold outlet and a connected fluid pipe. The flow is guided from the cold plate to the heat exchanger and back to the manifold via fluid pipes. The manifold guides the fluid back to the reservoir.

In operation 604, a particular component is removed from the manifold. For example, a pump and/or the reservoir is removed from the manifold by disengaging male and female ends and of quick release connectors 170 corresponding to the particular component.

In operation 606, inlet and outlet channels of the manifold corresponding to the removed component are sealed. For example, the inlet and outlet channels of the manifold corresponding to the removed component include male and female ends and of a pair of quick release connectors coupling the removed component to the manifold. In response to the particular component being removed, the male and female ends and close, thereby sealing the inlet and outlet channels of the manifold corresponding to the removed component. Furthermore, the female and male ends and corresponding to the inlet and outlet of the removed component also automatically close in response to the pair of quick release connectors being disconnected. Consequently, the inlet and outlet channels of the removed components are also sealed when the pair of quick release connectors are disconnected.

In operation 608, at least on connected pump maintains the flow of cooling fluid through the cooling system when the reservoir and/or another pump is removed. For example, when the first pump is removed from the cooling, the sealed male and female ends and prevent the fluid from flowing out of a first outlet and a first inlet of the manifold 150. The manifold 150 directs the flow of fluid through a first check valve, through the second outlet and to the second pump. The second pump maintains the flow of fluid through the cooling system. The fluid flow circulates through the rest of the cooling system. Additionally, the check valves of the manifold prevent a back flow of the fluid through the manifold.

Accordingly, one of the pumps and the reservoir may be removed during operation without the cooling fluid leaking onto the chassis and impacting electronic components. Further, the removed component can be quickly and easily replaced by fluidly coupling a new component to the manifold via the quick release connectors without shutting down the cooling system 100, 100'. Therefore, the cooling system 100, 100' may continuously operate during a maintenance operation.

According to an example embodiment, a system includes a cold plate configured to thermally couple to a heat source and conduct heat from the heat source to a fluid, a heat exchanger fluidly coupled to the cold plate and configured to dissipate heat from the fluid, a first pump and a second pump configured to induce a flow in the fluid, a reservoir configured to store at least a portion of the fluid, and a manifold. The manifold is directly fluidly coupled to each of the cold plate, the heat exchanger, an inlet and an outlet of the first pump, an inlet and an outlet of the second pump, and an inlet and an outlet of the reservoir.

In one form of the system, the system further includes a carrier configured prevent fluid from leaking outside of the carrier, wherein the first pump, the second pump, and the reservoir are removably coupled to the carrier. The second pump may be configured to maintain the flow of the fluid when the first pump is removed.

In one form of the system, the manifold further includes a first set of quick release connectors; a second set of quick release connectors and a third set of quick release connectors; a first inlet and a first outlet fluidly coupled to the first pump via the first set of quick release connectors; a second inlet and a second outlet fluidly coupled to the second pump via the second set of quick release connectors; and a third inlet and a third outlet fluidly coupled to the reservoir via the third set of quick release connectors. The first set of quick release connectors may be configured to close in response to the first pump being removed. The second set of quick release connectors may be configured to close in response to the second pump being removed. The third set of quick release connectors may be configured to close in response to the reservoir being removed. When closed, quick release connectors of the first set, the second set and the third set, may prevent the fluid flow from leaking from the manifold and/or a removed first pump, removed second pump, and/or removed reservoir. The manifold may further include a first check valve disposed between the first inlet and the first outlet, a second check valve disposed between the second inlet and the second outlet, and a third check valve disposed between the third inlet and the third outlet. The first check valve may be configured to prevent fluid flow from the first inlet to the first outlet. The second check valve may be configured to prevent fluid flow from the second inlet to the second outlet. The third check valve may be configured to prevent fluid flow from the third inlet to the third outlet. The manifold may be configured to guide fluid flow from the third inlet to the first outlet and from the first inlet to the second outlet.

In one form of the system, the first pump, the second pump, and the reservoir are arranged in series.

In one form of the system, the manifold further includes a fourth outlet fluidly coupled to the cold plate and a fourth inlet fluidly coupled to the heat exchanger.

In one form of the system, the manifold is configured to direct a flow of fluid from the reservoir to the first pump, the second pump, the cold plate, the heat exchanger, and back to the reservoir; and bypass the flow of fluid around one of the reservoir, the first pump, and the second pump.

In one form of the system, the manifold is further configured to bypass the flow of fluid around the reservoir and the first pump or the second pump.

According to another example embodiment, a system includes a cold plate configured to thermally couple to a heat source and conduct heat from the heat source to a fluid, a heat exchanger fluidly coupled to the cold plate and configured to dissipate heat from the fluid, a first pump and a second pump configured to induce a flow in the fluid, a reservoir configured to store at least a portion of the fluid; and a manifold. The manifold includes a first inlet and a first outlet for fluidly coupling to the first pump, a second inlet and a second outlet for fluidly coupling to the second pump, a third outlet for fluidly coupling to the cold plate, a third inlet for fluidly coupling to the heat exchanger; and a fourth inlet and a fourth outlet for fluidly coupling to the reservoir.

In one form of the system, the system further includes a first check valve disposed between the first inlet and the first outlet, a second check valve disposed between the second inlet and the second outlet, and a third check valve disposed between the fourth inlet and the fourth outlet. The first check valve is configured to prevent fluid flow from the first inlet to the first outlet, the second check valve is configured to prevent fluid flow from the second inlet to the second outlet; the third check valve is configured to prevent fluid flow from the fourth inlet to the fourth outlet.

In one form of the system, the system further includes a carrier configured prevent fluid from leaking outside of the carrier wherein the first pump, the second pump, and the reservoir are removably coupled to the carrier. The second pump may be configured to maintain the flow of the fluid when the first pump is removed.

In one form of the system, the first inlet and the first outlet are configured to prevent fluid flow when the first pump is disconnected. The second inlet and outlet are configured to prevent fluid flow when the second pump is disconnected. The fourth inlet and fourth are configured to prevent fluid flow when the reservoir is disconnected.

According to yet another example embodiment, a method includes guiding a flow of fluid through a plurality of components, a cold plate, a heat exchanger, and a manifold. The plurality of components include a plurality of pumps and a reservoir fluidly coupled to the manifold. Removing and disconnecting a particular component of the plurality of components from the manifold. Sealing an inlet channel and an outlet channel of the manifold corresponding to the particular component via quick release connectors, and maintaining the flow of fluid to the cold plate, the heat exchanger, and the manifold via at least one connected pump of the plurality of pumps.

In one form of the method, guiding a flow of fluid through the plurality of components, the cold plate, the heat exchanger, and the manifold includes transporting the fluid from the reservoir to the manifold, transporting the fluid from the manifold to a first pump of the plurality of pumps, pumping the fluid from the first pump back to the manifold, guiding the fluid from the manifold to a second pump of the plurality of pumps, pumping the fluid from the second pump to the manifold, guiding the fluid from the manifold through the cold plate and the heat exchanger, and back to the manifold, and guiding the fluid from the manifold to the reservoir. The method may further include preventing a back flow of fluid from the second pump to the first pump and the reservoir and/or from the first pump to the reservoir via check valves.

In one form of the method, sealing the inlet channel and the outlet channel of the manifold corresponding to the particular component includes closing valves of the quick release connectors corresponding to the particular component in response to the particular component being removed.

Reference may be made to the spatial relationships between various components and to the spatial orientation of various aspects of components as depicted in the attached drawings. However, as will be recognized by those skilled in the art after a complete reading of the present disclosure, the devices, components, members, apparatuses, etc. described herein may be positioned in any desired orientation. Thus, the use of terms such as 'above', 'below', 'upper', 'lower', 'top', 'bottom', or other similar terms to describe a spatial relationship between various components or to describe the spatial orientation of aspects of such components, should be understood to describe a relative relationship between the components or a spatial orientation of aspects of such components, respectively, as the components described herein may be oriented in any desired direction. When used to describe a range of dimensions and/or other characteristics (e.g., time, pressure, temperature, distance, etc.) of an element, operations, conditions, etc. the phrase 'between X and Y' represents a range that includes X and Y.

For example, it is to be understood that terms such as "left," "right," "top," "bottom," "front," "rear," "side," "height," "length," "width," "upper," "lower," "interior," "exterior," "inner," "outer" and the like as may be used herein, merely describe points of reference and do not limit the present embodiments to any particular orientation or configuration. Further, the term "exemplary" is used herein to describe an example or illustration. Any embodiment described herein as exemplary is not to be construed as a preferred or advantageous embodiment, but rather as one example or illustration of a possible embodiment.

Further, the present disclosure may repeat reference numerals and/or letters in the various examples. This repetition is for the purpose of simplicity and clarity and does not in itself dictate a relationship between the various embodiments and/or configurations discussed. Example embodiments that may be used to implement the features and functionality of this disclosure will now be described with more particular reference to the accompanying figures.

Similarly, when used herein, the term "comprises" and its derivations (such as "comprising", etc.) should not be understood in an excluding sense, that is, these terms should not be interpreted as excluding the possibility that what is described and defined may include further elements, steps, etc. Meanwhile, when used herein, the term "approximately" and terms of its family (such as "approximate", etc.) should be understood as indicating values very near to those which accompany the aforementioned term. That is to say, a deviation within reasonable limits from an exact value should be accepted, because a skilled person in the art will understand that such a deviation from the values indicated is inevitable due to measurement inaccuracies, etc. The same applies to the terms "about" and "around" and "substantially".

As used herein, unless expressly stated to the contrary, use of the phrase 'at least one of', 'one or more of', 'and/or', variations thereof, or the like are open-ended expressions that are both conjunctive and disjunctive in operation for any and all possible combination of the associated listed items. For example, each of the expressions 'at least one of X, Y and Z', 'at least one of X, Y or Z', 'one or more of X, Y and Z', 'one or more of X, Y or Z' and 'X, Y and/or Z' can mean any of the following: 1) X, but not Y and not Z; 2) Y, but not X and not Z; 3) Z, but not X and not Y; 4) X and Y, but not Z; 5) X and Z, but not Y; 6) Y and Z, but not X; or 7) X, Y, and Z.

Additionally, unless expressly stated to the contrary, the terms 'first', 'second', 'third', etc., are intended to distinguish the particular nouns they modify (e.g., element, condition, node, outlet, inlet, valve, module, activity, operation, etc.). Unless expressly stated to the contrary, the use of these terms is not intended to indicate any type of order, rank, importance, temporal sequence, or hierarchy of the modified noun. For example, 'first X' and 'second X' are intended to designate two 'X' elements that are not necessarily limited by any order, rank, importance, temporal sequence, or hierarchy of the two elements. Further as referred to herein, 'at least one of' and 'one or more of' can be represented using the '(s)' nomenclature (e.g., one or more element(s)).

One or more advantages described herein are not meant to suggest that any one of the embodiments described herein necessarily provides all of the described advantages or that all the embodiments of the present disclosure necessarily provide any one of the described advantages. Numerous other changes, substitutions, variations, alterations, and/or modifications may be ascertained to one skilled in the art and it is intended that the present disclosure encompass all such changes, substitutions, variations, alterations, and/or modifications as falling within the scope of the appended claims.

What is claimed is:

1. A system comprising:
   a cold plate configured to thermally couple to a heat source and conduct heat from the heat source to a fluid;
   a heat exchanger fluidly coupled to the cold plate and configured to dissipate heat from the fluid;
   a first pump and a second pump configured to induce a flow in the fluid;
   a reservoir configured to store at least a portion of the fluid; and
   a manifold directly fluidly coupled to each of the cold plate, the heat exchanger, an inlet and an outlet of the first pump, an inlet and an outlet of the second pump and an inlet and an outlet of the reservoir,
   wherein the manifold is configured to bypass the flow of fluid around the inlet and the outlet of the reservoir when the reservoir is removed.

2. The system of claim 1, wherein the manifold further comprises:
   a first set of quick release connectors, a second set of quick release connectors and a third set of quick release connectors;
   a first inlet and a first outlet fluidly coupled to the first pump via the first set of quick release connectors;
   a second inlet and a second outlet fluidly coupled to the second pump via the second set of quick release connectors; and
   a third inlet and a third outlet fluidly coupled to the reservoir via the third set of quick release connectors.

3. The system of claim 2, wherein:
   the first set of quick release connectors is configured to close in response to the first pump being removed;
   the second set of quick release connectors is configured to close in response to the second pump being removed;
   the third set of quick release connectors is configured to close in response to the reservoir being removed; and
   when closed, quick release connectors of the first set, the second set and the third set, prevent fluid flow from leaking from the manifold and/or a removed first pump, removed second pump, and/or removed reservoir.

4. The system of claim 2, wherein the manifold further comprises:
   a first check valve disposed between the first inlet and the first outlet, the first check valve configured to prevent fluid flow from the first inlet to the first outlet;
   a second check valve disposed between the second inlet and the second outlet, the second check valve configured to prevent fluid flow from the second inlet to the second outlet; and
   a third check valve disposed between the third inlet and the third outlet, the third check valve configured to prevent fluid flow from the third inlet to the third outlet.

5. The system of claim 4, wherein the manifold is configured to guide fluid flow from the third inlet to the first outlet and from the first inlet to the second outlet.

6. The system of claim 1, further comprising a carrier configured to prevent fluid from leaking outside of the carrier, wherein the first pump, the second pump, and the reservoir are disposed in the carrier.

7. The system of claim 6, wherein the second pump is configured to maintain the flow of the fluid when the first pump is removed.

8. The system of claim 6, wherein the first pump is configured to maintain the flow of the fluid when the second pump is removed.

9. The system of claim 1, wherein the manifold is further configured to:
   direct a flow of fluid from the reservoir to the first pump, the second pump, the cold plate, the heat exchanger, and back to the reservoir; and
   bypass the flow of fluid around one of the first pump, and the second pump.

10. The system of claim 9, wherein the manifold further includes a plurality of check valves to bypass the flow of fluid.

11. The system of claim 1, wherein the first pump, the second pump, and the reservoir are arranged in series.

12. The system of claim 1, wherein the manifold further comprises a fourth outlet fluidly coupled to the cold plate and a fourth inlet fluidly coupled to the heat exchanger.

13. The system of claim 1, wherein the manifold is further configured to bypass the flow of fluid around the inlet and the outlet of the first pump or the second pump when the first pump or the second pump is removed.

14. A system comprising:
   a chassis for receiving:
      a cold plate configured to thermally couple to a heat source and conduct heat from the heat source to a fluid;
      a heat exchanger fluidly coupled to the cold plate and configured to dissipate heat from the fluid;
      a first pump and a second pump configured to induce a flow in the fluid;
      a reservoir configured to store at least a portion of the fluid;
      a manifold comprising:
         a first inlet and a first outlet for fluidly coupling to the first pump;
         a second inlet and a second outlet for fluidly coupling to the second pump;
         a third outlet for fluidly coupling to the cold plate;
         a third inlet for fluidly coupling to the heat exchanger; and
         a fourth inlet and a fourth outlet for fluidly coupling to the reservoir; and
      a carrier configured to capture fluid leaking from at least one of the first pump, the second pump, the reservoir, and the manifold.

15. The system of claim 14, wherein the first pump, the second pump, and the reservoir are disposed in the carrier.

16. The system of claim 15, wherein the second pump is configured to maintain the flow of the fluid when the first pump is removed.

17. The system of claim 15, wherein the first pump is configured to maintain the flow of the fluid when the second pump is removed.

18. The system of claim 14, further comprising:
   a first check valve disposed between the first inlet and first outlet, the first check valve configured to prevent fluid flow from the first inlet to the first outlet;
   a second check valve disposed between the second inlet and the second outlet, the second check valve configured to prevent fluid flow from the second inlet to the second outlet; and a third check valve disposed between the fourth inlet and the fourth outlet, the third check valve configured to prevent fluid flow from the fourth inlet to the fourth outlet.

19. The system of claim 14, wherein the first inlet and the first outlet are configured to prevent fluid flow when the first pump is disconnected;

the second inlet and outlet are configured to prevent fluid flow when the second pump is disconnected; and the fourth inlet and fourth outlet are configured to prevent fluid flow when the reservoir is disconnected.

20. The system of claim 14, wherein the manifold further includes a plurality of check valves to prevent a back flow of fluid from the second pump to the first pump and the reservoir and/or from the first pump to the reservoir.

* * * * *